United States Patent [19]

Fossum et al.

[11] Patent Number: 5,168,573
[45] Date of Patent: Dec. 1, 1992

[54] MEMORY DEVICE FOR STORING VECTOR REGISTERS

[75] Inventors: Tryggve Fossum, Northboro; Dwight P. Manley, Holliston; Francis X. McKeen, Westboro; Michael M. Tahranian, Boxboro, all of Mass.

[73] Assignee: Digital Equipment Corporation, Maynard, Mass.

[21] Appl. No.: 328,561

[22] Filed: Mar. 24, 1989

Related U.S. Application Data

[62] Division of Ser. No. 93,499, Aug. 31, 1987, Pat. No. 4,980,817.

[51] Int. Cl.⁵ .............................................. G06F 12/02
[52] U.S. Cl. .............................. 395/800; 364/DIG. 1; 364/DIG. 2; 364/957; 364/232.21
[58] Field of Search ........................................ 395/800; 364/200 MS File, 900 MS File

[56] References Cited

U.S. PATENT DOCUMENTS

| | | | |
|---|---|---|---|
| 4,128,880 | 12/1978 | Cray, Jr. | 364/200 |
| 4,435,765 | 3/1984 | Uchida et al. | 364/200 |
| 4,490,786 | 12/1984 | Nakatani | 364/200 |
| 4,617,625 | 10/1986 | Nagashima et al. | 364/200 |
| 4,636,942 | 1/1987 | Chen et al. | 364/200 |
| 4,661,900 | 4/1987 | Chen et al. | 364/200 |
| 4,665,479 | 5/1987 | Onaga | 364/200 |
| 4,680,730 | 7/1987 | Omoda et al. | 364/900 |
| 4,755,931 | 7/1988 | Abe | 364/200 |
| 4,766,535 | 8/1988 | Auerbach et al. | 364/200 |
| 4,843,543 | 6/1989 | Isobe | 364/200 |

OTHER PUBLICATIONS

IBM System/370 "Vector Operations" Publication No. SA22-7125-0 File No. S370-01 (Jan. 1986) pp. i, ii, iii, iv, v, vi, 1-1 to 1-2, 2-1 to 2-31, 3-1 to 3-41, A1 to A8, B-1 to B-13, X-1 to X-4.
Cray-2 Computer System Functional Description Publication No. HR-2000, Cray Research, Inc. May 1985.

Primary Examiner—Thomas C. Lee
Assistant Examiner—Robert B. Harrell
Attorney, Agent, or Firm—Finnegan, Henderson, Farabow, Garrett and Dunner

[57] ABSTRACT

A vector register provides the capability for simultaneously writing through at least two write ports and simultaneous reading from at least two read ports. In addition, a barber pole technique for storing words from logical vector registers into banks is provided to minimize conflicts.

11 Claims, 7 Drawing Sheets

MEMORY DEVICE FOR STORING VECTOR REGISTERS

RELATED APPLICATIONS

This application is a divisional of U.S. application Ser. No. 07/093,499, filed Aug. 31, 1987, now U.S. Pat. No. 4,980,817.

BACKGROUND OF THE INVENTION

The present invention relates to the field of memories in general, and specifically, relates to the field of vector registers for data processors.

Computers have long used both special and general purpose registers to store frequently accessed data. More recently, certain computers have added vector registers to store vector elements, which are the data operated on by vector instructions. Vector processing is especially well-suited to expedite repetitive operations performed on sequential data elements. Examples of vector registers are shown in Cray, Jr., U.S. Pat. No. 4,128,880; Chen et al., U.S. Pat. No. 4,636,942; and Chen et al., U.S. Pat. No. 4,661,900.

Vector processing is often performed in a pipelined fashion. The tasks of fetching the vector elements, performing an arithmetic operation on them, and storing the results are broken down into small fragments which are executed in parallel by dedicated hardware. Due to the repetitive nature of vector operations, such pipelining increases the speed of processing by a factor almost equal to the number of pipeline stages if the vector registers can simultaneously produce enough vector elements for all the pipeline stages and store the results also. "Chaining" is a term used to refer to mechanisms that use results from certain operations as operands in later operations without added delay. A discussion of chaining, although in a slightly different context, appears in Chen et al., U.S. Pat. No. 4,661,900.

Even with the use of chaining and pipeline processing, however, conventional vector registers suffer from several disadvantages. For example, if vectors are stored in main memory, large memory delays result and a high bandwidth communication path must be established between memory and the vector processors. Therefore, it is attractive to store vectors in special vector registers.

Designing special vector registers involves several tradeoffs. One is hardware cost and another is performance. To obtain both speed and flexibility, vector registers are usually built using flip-flops or latches. Such registers, however, are both bulky and expensive. The use of conventional RAM chips avoids the size and cost problems but does not satisfy the access requirements due to the monolithic organization of such chips.

Vector registers must supply operands to multiple processing streams and accept the results. To maximize performance, the vector register file must support multiple simultaneous accesses during each processor cycle. This requirement is very difficult to achieve using conventional RAM components.

Furthermore, vector registers need to be physically connected to the processing elements to exchange operands. Such connections often create problems of excessive pin requirements, excessive signal load, and conflicts from wire sharing.

Finally, the main purpose of vector processing is to achieve high processing performance. Thus, it is necessary to cycle the storage elements in very short time periods. Using traditional RAM chip implementations, short time periods are difficult to achieve because the cycles need to include address distribution, RAM access times, and data distribution. The attainment of high speeds is further complicated by the need to allow for clock skew.

Therefore, it is an object of the present invention to provide vector registers which can be used with great efficiency to speed up vector processing, for example by using short cycle times.

It is also an object of the present invention to configure the vector registers using nonstandard RAM cell technology, to satisfy the access requirements of high speed vector registers.

Another object of the invention is to minimize the physical interconnection problems between vector registers and the processing elements.

Still another object of the invention is to improve the capability of the vector registers to use overlapping techniques and pipeline processing, by providing simultaneous multiple accesses to vector registers.

A further object of the invention is to provide a vector register which minimizes conflicts during consecutive register accesses to any individual register.

Additional objects and advantages of the present invention will be set forth in part in the description which follows and in part will be obvious from that description or may be learned by practice of the invention. The objects and advantages of the invention may be realized and attained by the methods and apparatus particularly pointed out in the appended claims.

SUMMARY OF THE INVENTION

The present invention overcomes the problems of the prior art and achieves the objects listed above with a vector register that allows simultaneous read operations as well as simultaneous write operations.

To achieve the objects and in accordance with the purpose of the invention, as embodied and as broadly described herein, a vector register file of this invention which is capable of simulataneously servicing a plurality of file access requests composed of either write commands with write addresses or read commands with read addresses, comprises a register array for storing data; reading means, coupled to the register array and responsive to read selection signals, for simultaneously outputting the stored data through at least two of a plurality of read ports; writing means, coupled to the register array and responsive to write selection signals, for simultaneously storing the data into the array through at least two of a plurality of write ports; first selection means, coupled to the reading means, for generating the read selection signals in response to the read addresses and the read control signals; and second selection means, coupled to the writing means, for generating the write selection signals in response to the write addresses and write control signals.

More particularly, the vector registers of this invention use an economical RAM-cell structure, but the RAM is broken into smaller units that can be cycled independently for easy access. The RAM structure is broken into a prescribed number of banks, for example 16, that can be accessed independently. This allows multiple read and write ports which can be independently accessed. In addition, by storing the vector registers in those banks in a staggered, helical storage pattern (also called a barber pole technique), the number of conflicts between banks can be reduced and a storage queue as part of the vector register allows temporary storage of results when a bank is temporarily busy.

The use of the RAM structure is streamlined by latching the addresses and data locally which allows the distribution of the signals to be overlapped during the access time of the RAM. Also, by selecting the addresses of the individual banks locally, the clock skew is minimized as is the skew of the write pulses which are also generated locally.

By using certain of the dedicated read and write ports for each processing element, the connection between the registers and the processing elements can be simplified, thereby reducing the number of conflicts. Further reductions are achieved by local selection of data sources and routing of results, as well as the use of scalar registers which use the same interconnects as the vector registers.

The accompanying drawings, which are incorporated in and which constitute a part of this specification, illustrate one embodiment of the invention and, together with the description, explain the principles of the invention.

BRIEF DESCRIPTION OF THE DRAWINGS

FIG. 6 is a block diagram of a preferred embodiment of conflict detection circuitry in accordance with the present invention;

FIG. 7 is a preferred embodiment of address generation circuitry for multipliers 70 in FIG. 2;

FIG. 8 is a preferred embodiment of address generation circuitry for adder 8 in FIG. 2; and FIG. 9 is a preferred embodiment of address generation circuitry for mask unit 90 in FIG. 2.

DESCRIPTION OF THE PREFERRED EMBODIMENT

Reference will now be made in detail to a presently preferred embodiment of the invention, an example of which is illustrated in the accompanying drawings.

Figure 1:
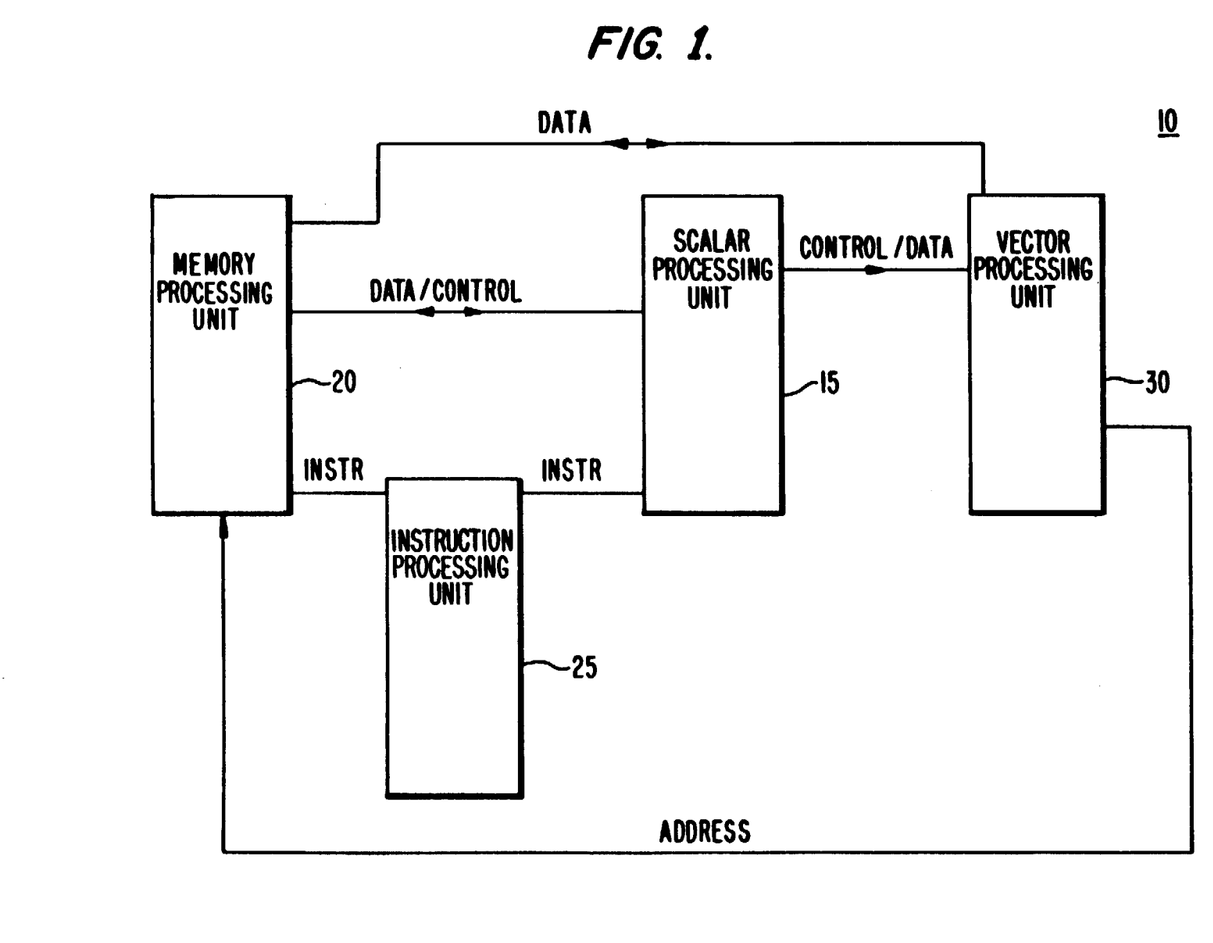
FIG. 1 is a drawing of a data processing system containing a preferred embodiment of the vector register in accordance with the present invention.

FIG. 1 shows an example of a data processing system 10 comprising various elements. Vector Processing Unit 30 contains a preferred embodiment of the vector register file of the present invention. Instruction Processing Unit 25 includes an instruction parser which receives instructions from memory unit 20 and sends instruction data to a Scalar Processing Unit 15. Scalar Processing Unit 15 executes all scalar instructions and sends vector instructions and vector data to Vector Processing Unit 30. A Memory Processing Unit 20 receives control and data signals from Instruction Processing Unit 25, Scalar Processing Unit 15, and Vector Processing Unit 30, and arbitrates, processes and responds to those signals. There may be other elements in data processing system 10 but an understanding of such elements is not needed for an understanding of the present invention.

Figure 2:
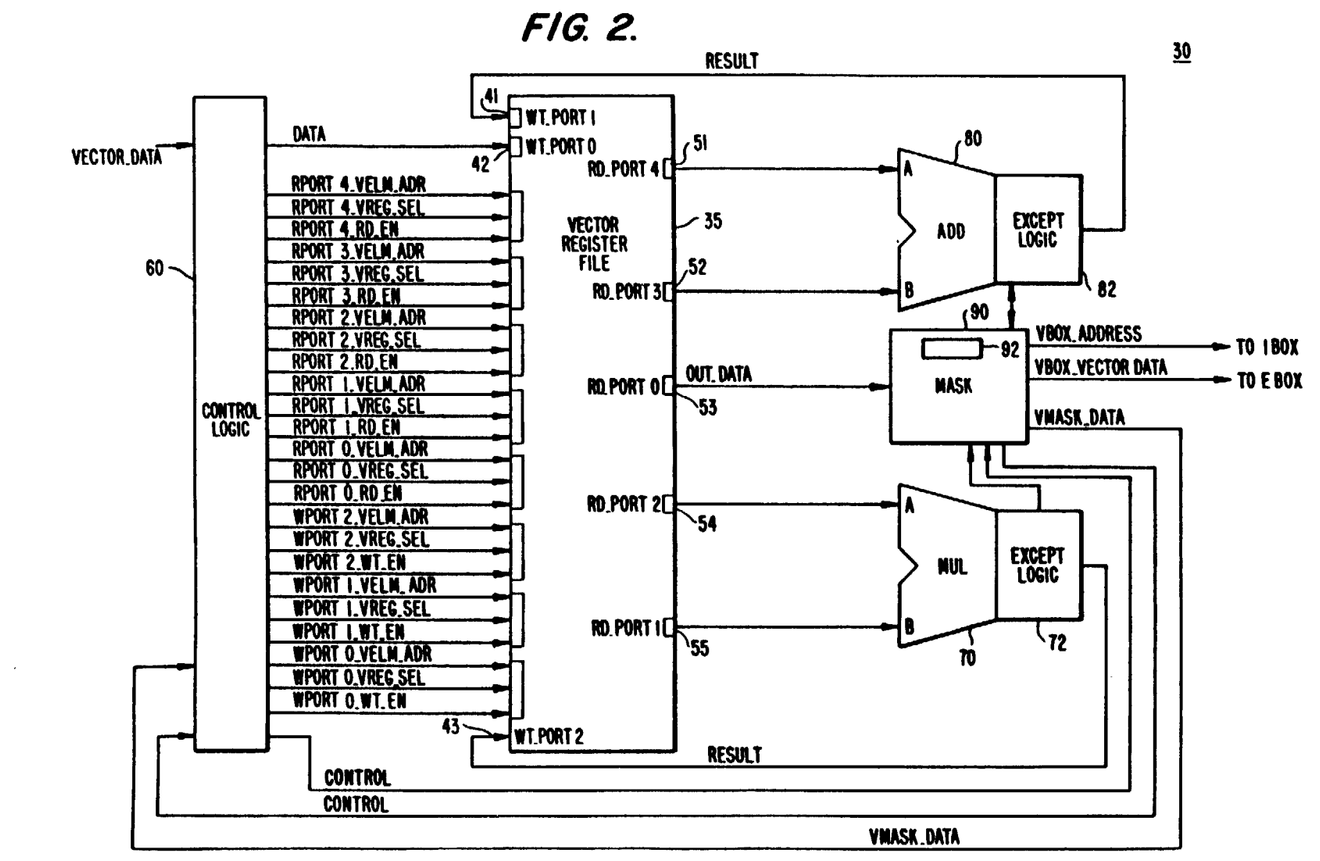
FIG. 2 is a block diagram of the Vector Processing Unit of FIG. 1 which contains the preferred embodiment of the vector register of this invention.

FIG. 2 is a diagram showing a preferred embodiment of the Vector Processing Unit 30 in FIG. 1. As shown in FIG. 2, Vector Processing Unit 30 includes control logic 60 as the main interface with data processing system 10 and a vector register file 35 for servicing file access requests. Such requests can either be write requests composed of write control signals and write addresses, or read requests composed of read control signals and read addresses. Vector register file 35 contains a plurality of write ports, shown as WT PORT0-WT PORT2 and denoted by the reference numbers 41–43, as well as a plurality of read ports, shown as RD PORT0-RD PORT4 and denoted by the reference numbers 51-55. The write ports receive write control signals and write addresses as well as write data. For example, for write port 42 (WT PORT0), a write control signal is WPORT0 WT EN from control logic 60. The write addresses, which are also received from control logic 60, are denoted by WPORT0 VREG SEL and WPORT0 VELM ADDR signals.

The write data for the write port 42 comes from data lines provided by control logic 60. The other write ports are similar except that WT PORT1 and WT PORT2 receive data from the outputs of other circuit elements, such as vector multiplier 70 and vector adder 80. All the write ports receive their control signals from control logic 60.

The read ports operate similarly to the write ports. For example, read port 53, corresponding to RD PORT0, receives the control signal RPORT0 RD EN and the address signals RPORT0 VREG SEL and RPORT0 VELM ADDR from control logic 60. The read data for read port 53 is provided to a mask unit 90.

The other read ports also receive their control and address signals from control logic 60. The outputs from read ports 55 and 54, RPORT1 and RPORT2, respectively, are connected to a vector multiplier 70, and the outputs of read ports 52 and 51, RPORT3 and RPORT4, respectively, are connected to a vector adder 80.

In addition to such interface logic, control logic 60 preferably includes control logic, some of which is described below, and an instruction parser. The instruction parser receives information from Scalar Processing Unit 15 (i.e., instructions in the VECTOR DATA) and uses such information to control the operations of a vector multiplier 70, vector adder 80, or mask unit 90. The control logic in control logic 60 oversees the scheduling of all activity in the Vector Processing Unit.

Figure 3A:
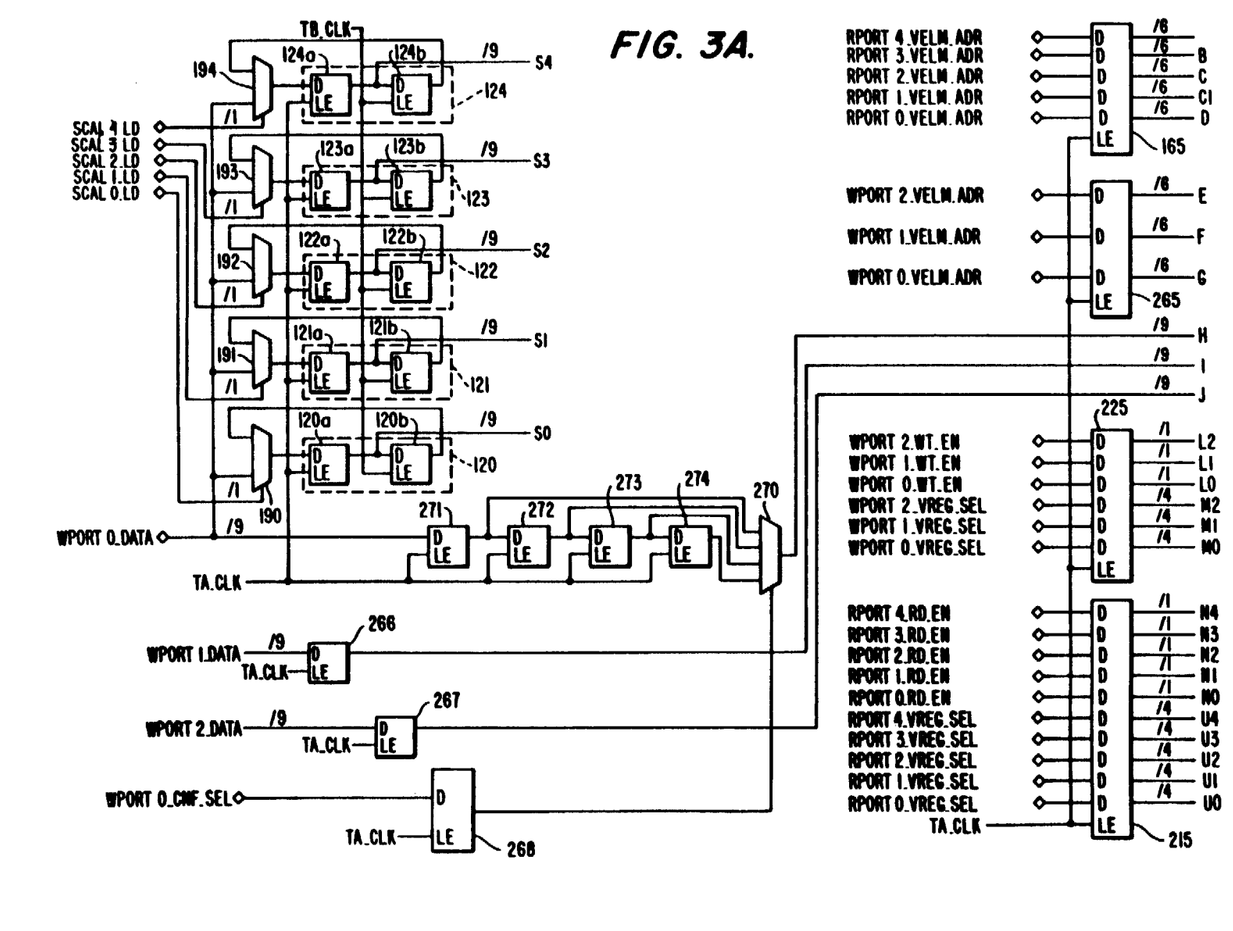
FIGS. 3A and 3B are circuit diagrams of elements in the preferred embodiment of the vector register in FIG. 2.
Figure 3B:
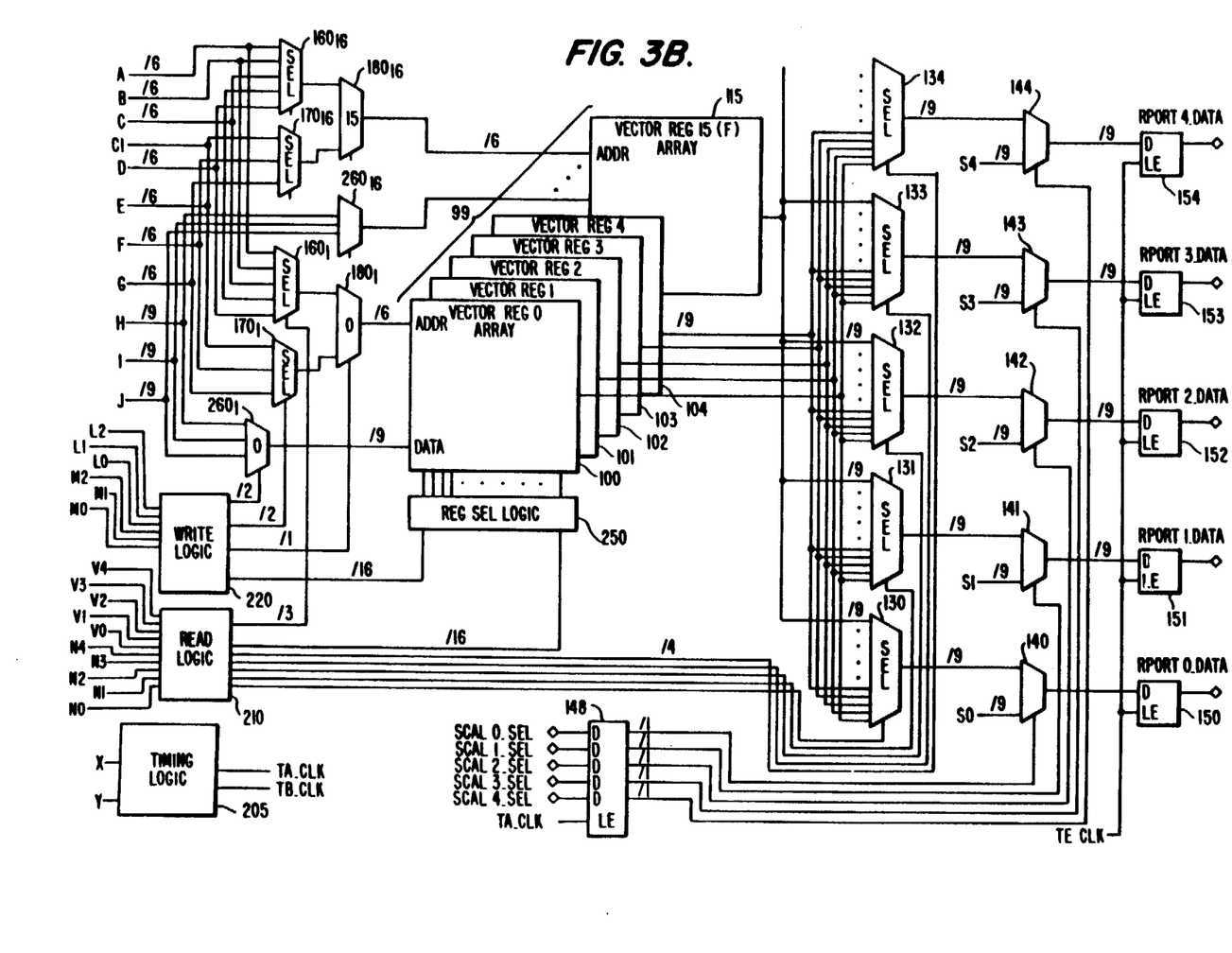
Figure 4A:
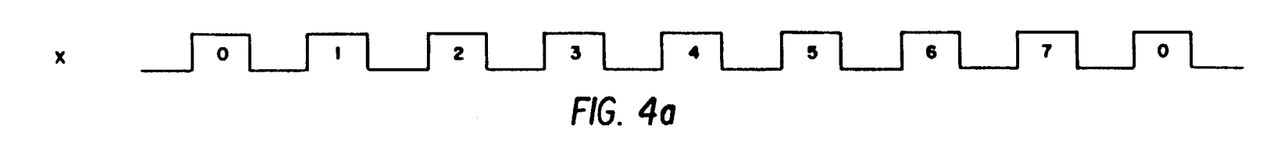
FIGS. 4a, 4b, 4c, 4d, 4e, 4f, 4g, 4h, 4i, 4j, 4k, 4l, and 4m are timing diagrams for reading and writing in the vector register shown in FIGS. 3A and 3B.
Figure 4B:
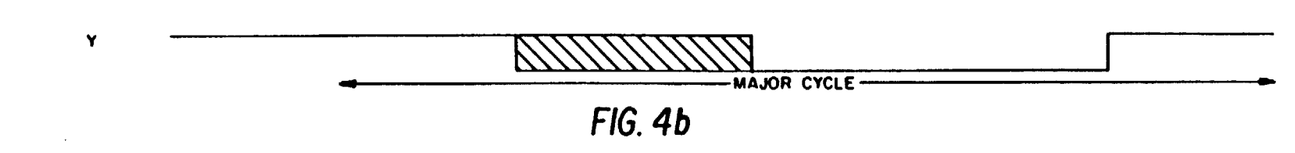
Figure 4C:
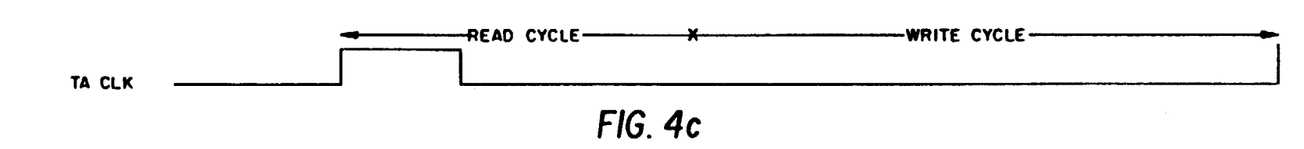
Figure 4D:
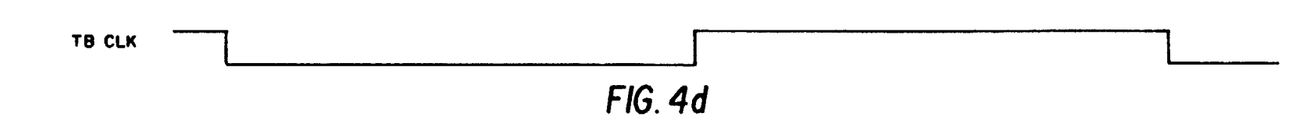
Figure 4E:
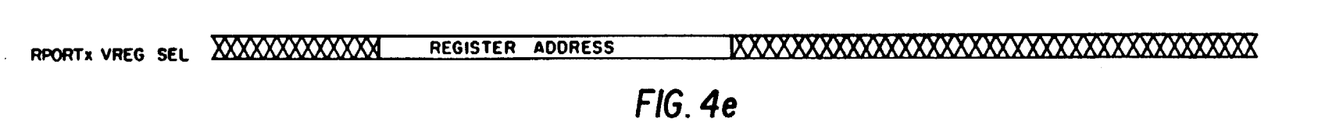
Figure 4F:
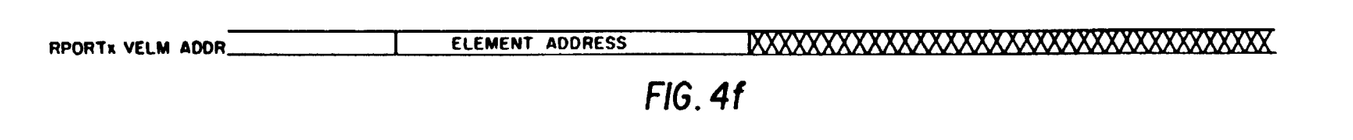
Figure 4G:
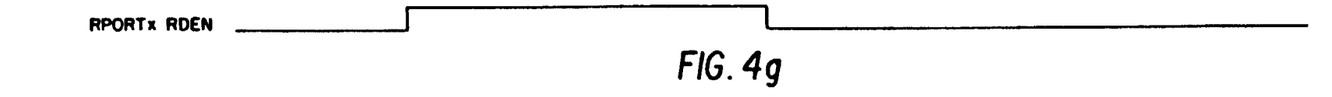
Figure 4H:
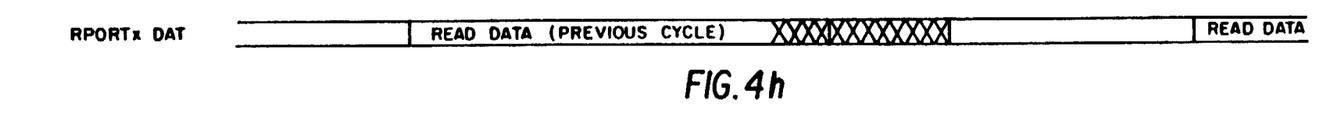
Figure 4I:
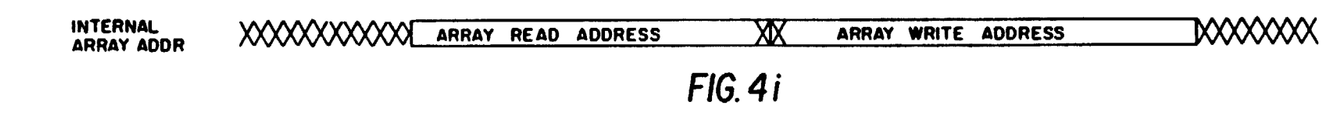
Figure 4J:
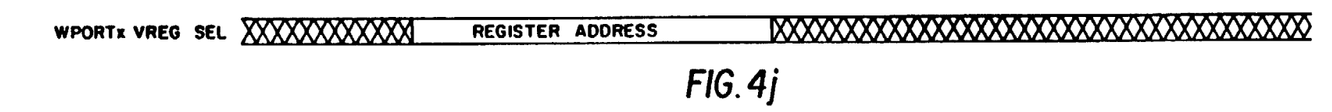
Figure 4K:
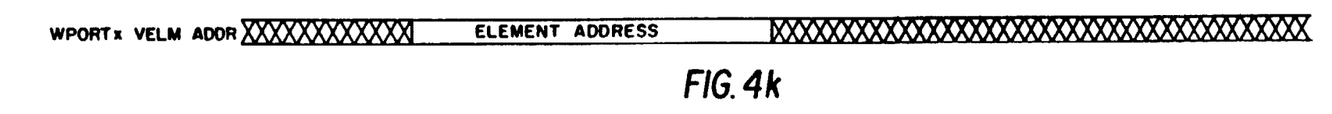
Figure 4L:
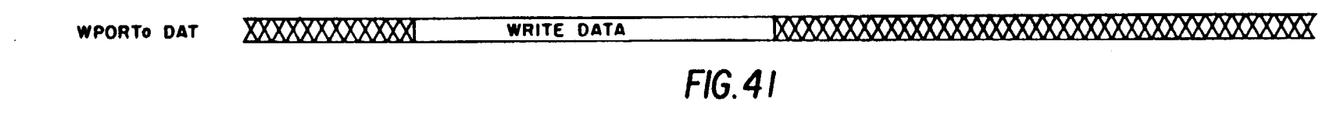
Figure 4M:
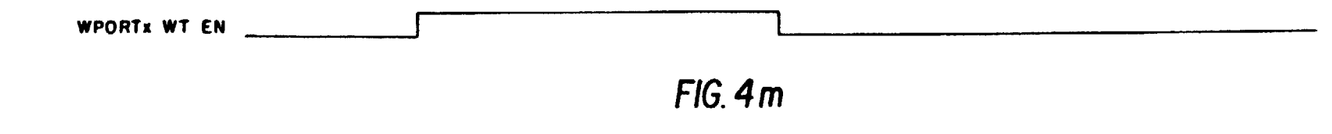

Vector register file 35 is shown in greater detail in FIGS. 3A and 3B. Preferably the circuitry in these figures is contained in a single integrated circuit chip to accomplish the desired objects of incresed speed. The vector register file includes a register array 99 for storing data, which is preferably a modified RAM structure. Register array 99 comprises a plurality of subarrays 100-115, which together form a file of vector registers VREG0-VREG15. Preferably, each subarray has 64 elements, thus register array 99 provides a total storage for 1,024 64-bit elements (i.e., 8,192 bytes). Different size arrays and a different organization of arrays are of course possible in accordance with the present invention.

As shown in FIG. 3B, register array 99 is preferably constructed from a plurality of subarray portions. In the preferred embodiment, register array 99 logically comprises 16 subarrays. In the preferred embodiment of this invention, register array 99 is physically "sliced" into eight demiarrays each with 16 subarrays of 64 elements each. Each such element has eight data bits and one parity bit. FIGS. 3A and 3B represent a "slice" of vector register array 99 with 1,024 bytes. The use of slices, however, is preferred but not required in accordance with the broadest aspects of the present invention.

The addresses both for the write ports and the read ports, are divided into two portions. The first portion, represented by RPORTx VREG SEL or WPORTx VREG SEL (the lower case "x" means that the discussion refers to any of the read or write ports), is used to select one of the 16 subarrays. In the preferred embodiment, each of these signals preferably comprises four bits. The second portion of the address corresponds to the RPORTx VELM ADR or the WPORTx VELM ADR signal and is used to select one of the 64 elements within the selected subarray. In the preferred embodiment of this invention, these signals have six bits.

The vector register file of the present invention also includes a scalar register file (shown in FIG. 3A) containing scalar values. As shown in FIG. 3A, scalar registers 120-124 contain such scalar values. Each of the scalar registers 120-124 is constructed from a pair of latches 120a/120b-124a/124b. In the preferred embodiment of the invention, there is one scalar register dedicated to each of the five read ports, but such correspondence is not required in all embodiments of the present invention.

Scalar registers 120-124 are preferably loaded from the WPORT0 data line in response to the appropriate control signal SCAL0 LD-SCAL4 LD for scalar registers 120-124, respectively. The SCALx LD signals are received from the instruction parser in control logic 60. Depending upon the values for SCAL0 LD-SCAL4 LD, the associated scalar register 120-124 either recirculates its output or loads in the data from the WPORT0 line at the clock pulse TA CLK.

As shown in FIG. 3A, the outputs of the scalar registers 120-124 are denoted as S0-S4, respectively. Each of the scalar registers 120-124 is also 64 bits wide, as are the elements of register array 99, and the scalar registers also include eight total bits of parity. Preferably, the scalar registers are also stored in slices of eight equal-sized elements each corresponding to a different slice of register array 99.

In accordance with the present invention, the vector register file includes reading means, coupled to the register array and responsive to read selection signals, for simultaneously outputting the stored data from the register array through at least two of the read ports. The reading means can also include signal routing means for simultaneously outputting the data from at least two of the subarrays. In the preferred embodiment of the vector register file of this invention shown in FIGS. 3A and 3B, the signal routing means includes a plurality of multiplexers each having inputs coupled to the subarrays and an output coupled to a different one of the read ports. Multiplexers 130-134 act as such a reading means.

Each of the multiplexers 130-134 has 16 inputs, which are each connected to a different one of the subarrays 100-115, and each of the multiplexers 130-134 has an output which can be coupled, eventually, to a different one of the read ports. The output produced by each of multiplexers 130-134 corresponds to one of the inputs received from the register subarrays. Each of multiplexers 130-134 also has a selection terminal SEL which receives a different four bit selection code from read logic 210 identifying the subarray from which the data is to be read. The four bit selection codes for each of the multiplexers 130-134 are simultaneously generated resulting in simultaneous outputting of data from at least two subarrays.

The vector register file of the present invention also includes, as part of the reading means, means for outputting the contents of the scalar register file in response to the selection signals. As can be seen from FIGS. 3A and 3B, multiplexers 140-144 can be used for outputting the contents of the different scalar register files 120-124, respectively. One input of each of the multiplexers 140-144 is connected to the output of one of the multiplexers 130-134, respectively, and the second input of each of the multiplexers 140-144 is coupled to the output of one of the scalar registers 120-124, respectively. Each of the multiplexers 140-144 has a selection input (SEL) which is coupled to receive a signal SCAL0 SEL-SCAL4 SEL, respectively. Those selection signals are buffered by latch 148 whose clock input signals TA CLK. The SCALx SEL signals are received from the instruction parser in control logic 60.

In response to the SCALx SEL signals, multiplexers 140-144 select either the output of multiplexers 130-134 or the output of the scalar registers 120-124. The selected signals, which then appear at the outputs of multiplexers 140-144, are latched into storage elements 150-154, respectively, in response to the TB CLK signal. Storage elements 150-154 contain the data outputs for the read ports 50-54 (RD PORT0-RD PORT4), respectively.

In accordance with the present invention, the reading means also includes a first set of multiplexers each having an output coupled to an address terminal of a different one of the subarrays and having inputs coupled to receive word selection portions of the read addresses. As shown in FIGS. 3A and 3B, multiplexers $160_1-160_{16}$ are such a set of multiplexers in a preferred embodiment of the invention. The input terminals of each of the multiplexers are connected to the output terminals of latch 165, which in turn has input terminals coupled to receive the six bits from RPORTx VELM ADR for each of the read ports. The clock terminal for latch 165 receives the TA CLK signal. The inputs to latch 165, and therefore to each of the multiplexers $160_1-160_{16}$, are the addresses for elements in particular subarrays.

The control terminal for each of multiplexers $160_1-160_{16}$, denoted as SEL, receives a three bit code from read logic 210 indicating which one of the inputs should be selected to be an output. The three bit SEL input identifies the element address for one of the five read ports.

The vector register file of the present invention also includes first selection means, coupled to the reading means, for generating the read selection signals in response to the read addresses and read control signals. As shown in FIG. 3B, read logic 210 provides the functions of such a selection means in the preferred embodiment of this invention by providing the selection signals both to multiplexers $160_1-160_{16}$ and multiplexers 130-134. Read logic 210 receives as inputs the RPORTx RD EN signals and as the addresses RPORTx VREG SEL signals. The RPORTx RD EN signals are single line signals which, when enabled, indicate that a particular address for a particular read port is valid. Read logic 210 encodes the RPORTx RD EN and VREG SEL signals for each of the ports in a manner known to persons of ordinary skill to obtain the three-bit signals for multiplexers $160_1$-$160_{16}$. Those signals identify the read port which is the source of the register element address and correctly route the VREG SEL signals to multiplexers 130-134 to determine the subarray which contains the data for each of the multiplexers.

Further in accordance with the present invention, the vector register file includes writing means, coupled to the register array and responsive to write selection signals, for simultaneously storing the data into the register array through at least two of the plurality of write ports. The writing means can include means for simultaneously storing the data into at least two of the subarrays. Preferably, such storing means includes a plurality of multiplexers each having inputs connected to sources of data and an output connected to a different one of the subarrays. Such multiplexers are shown in FIG. 3B as multiplexers $260_1$-$260_{16}$ which have inputs receiving data from each of the write ports and an output to subarrays 100-115 of register array 99. Multiplexers $260_1$-$260_{16}$ each have a control terminal which receives a 2 bit code from write logic 220 specifying the source of data (i.e., from which write port data lines).

The writing means can also include a first set of multiplexers, each having an output coupled to an address terminal of a different one of the subarrays and inputs coupled to receive the word selection portions of the write addresses. Multiplexers $170_1$-$170_{16}$ shown in FIG. 3B provide such a function. Each of multiplexers $170_1$-$170_{16}$ has inputs coupled to receive a different one of the WPORTx VELM ADR signals which are buffered through latch 265 and timed via the TA CLK signal.

The control terminals of multiplexers $170_1$-$170_{16}$ are labeled SEL and each receive a 2-bit signal from write logic 220. That signal, as explained below, is derived from write control signals.

As shown in FIG. 3B, there is an additional set of multiplexers $180_1$-$180_{16}$ which each receive an input from a corresponding one of the registers $170_1$-$170_{16}$ and an input from a corresponding one of registers $160_1$-$160_{16}$. The outputs of the multiplexers $180_1$-$180_{16}$ are each coupled to a different one of subarrays 100-115. Multiplexers $180_1$-$180_{16}$ also receive a control signal from write logic 220 which indicates to multiplexers $180_1$-$180_{16}$ which input to select.

The vector register file of the present invention also includes second selection means, coupled to the writing means, for generating the write selection signals in response to the write addresses and write control signals. As shown in FIG. 3B, write logic 220 provides such selection signals to multiplexers $170_1$-$170_{16}$, to multiplexers $180_1$-$180_{16}$, and to multiplexers $260_1$-$260_{16}$. Write logic 220 receives the WPORTx WT EN signals and the WPORTx VERG SEL signals which are buffered through a latch 225 in response to the TA CLK signals. The WPORTx WT EN signals indicate when the data on the corresponding inputs are valid. Write logic 220 then uses the WPORTx VREG SEL signals for controlling the multiplexers $170_1$-$170_{16}$. The write logic 220 also controls multiplexers $180_1$-$180_{16}$ and $260_1$-$260_{16}$ by the same signals.

Register select logic 250 also receives control signals from write logic 220 and routes write enable signals to the vector registers 100-115. The sixteen write enable signals are generated by write logic 220 by decoding the WPORTx VREG SEL signals.

In addition to the vector register elements, the vector register circuit of this invention can include arithmetic means having inputs connected to selected ones of the read ports and outputs connected to selected ones of the write ports. Examples of such arithmetic means shown in FIG. 2 include vector multiplier 70, vector adder 80, and mask unit 90.

Vector adder 80 performs integer and floating point add or subtract operations on two 64 bit words supplied from the vector register file 35 via RD PORT3 and RD PORT4. Preferably adder 80 also performs certain logical and shift operations. The output of vector adder 80, labeled "RESULT," provides a data input to WT PORT1. Vector adder 80 also includes exception logic 82 coupled to mask unit 90 which permits adder 80 to perform operations upon condition and to advise mask unit 90 of arithmetic exception conditions (e.g., overflow).

Vector multiplier 70 performs an integer or floating point multiplication or division on two 64 bit words received from RD PORT1 and RD PORT2 of vector register file 35. The product or quotient of those inputs is a 64 bit word also labeled "RESULT" and is provided as input data to WT PORT2. Exception logic 72, which is coupled to mask unit 90, indicates to mask unit 90 when there is an arithmetic exception condition (e.g. overflow) resulting from the multiplication or division by multiplier 70.

Mask unit 90 receives data from vector register file 35 via RD PORT0 and provides vector data from Vector Processing Unit 30 to Scalar Processing Unit 15. Mask unit 90 also can read the data from RD PORT0 and convert it to an address for the Memory Processing Unit 20. In addition, mask unit 90 is coupled to exception logic 72 and 82 and latches their exception conditions.

Contained in mask unit 90 is a 64 bit mask register 92 with each bit corresponding to a different one of the vector elements in all vector registers. Mask register 92 can be loaded with data from the Scalar Processing Unit, via control logic 60, and can be used to control the writing into vector elements based on the condition of the mask register bit for that element.

FIG. 4 shows a diagram for the basic timing for reading and writing. Both the external timing and internal timing for vector register 99 are shown. Timing logic 205 in FIG. 3B uses the X and Y signals to generate the TA CLK and TB CLK signals. The TA CLK signal is used for external control signals. In the convention used to describe the timing, the major cycle is defined as the time between the assertion of successive TA CLK signals. Each major cycle comprises both a read cycle and a write cycle.

Generally, the read address is valid at the beginning of a major cycle. The read address, as explained above, comprises the RPORTx VREG SEL and the RPORTx VELM ADR signals. The RPORTx RD EN signal indicates that the address for the port is valid and a read operation will take place. The data read from vector register 99 is valid about 8 ns after the start of the cycle.

Internally, the first part of a major cycle is the read cycle during which the array/read address is selected by multiplexers $180_1$-$180_{16}$. The array read data output is available internally at the end of the read cycle.

Generally, the write address is valid externally at the same time as the read address. The write address comprises the WPORTx VREG SEL and the WPORTx VELM ADR signals. Similarly to the read address timing, the write addresses are clocked into vector register file 35 on a TA CLK signal. The WT-PORT0 data is latched on TA CLK signal. The write data for WPORT1 DATA and WPORT2 data is valid about 5 nsec after the TA CLK. The WPORTx WT EN signal indicates that a write operation for the indicated write port will take place.

Although the read and write addresses are valid externally at about the same time, internally the array write address is not valid until selected by multiplexers $180_1$-$180_{16}$ during the write cycle. The write cycle occurs after the read cycle. The write enable signals are generated by the register select logic 250 during the write cycle while the write data is valid.

Using the timing just described, the preferred embodiment of the present invention avails itself of pipeline processing and chaining by permitting up to five read accesses and three write accesses each major cycle. The preferred embodiment of the current invention further distinguishes itself from the prior art by allowing all of these accesses to be to the same vector register. A vector register of a vector register file of the prior art, as described by Chen et al. U.S. Pat. No. 4,661,900, allows only one read and one write during each major clock cycle.

To those of ordinary skill, it is readily apparent from the logic diagrams presented in FIGS. 3A and 3B that each subarray (100-115) allows only one read access and only one write access during each major cycle. If the elements of a vector register were assigned to an individual subarray then conflicts would clearly arise should more than one read or more than one write be desired during a major cycle. To minimize the occurrence of conflicts and to realize the full potential of the current invention the vector registers are preferably organized in a helical or "barber pole" arrangement. In such an arrangement, the architectually defined, programmer-visible registers are actually logical registers which are physically spread across the vector register file subarrays. Successive elements in each logical register have corresponding locations in different subarrays. Arranging the vector registers in this manner allows great flexibility in pipeline processing and, because a given vector register can service five reads and three writes simultaneously, software can use the vector register file more effectively.

Figure 5:
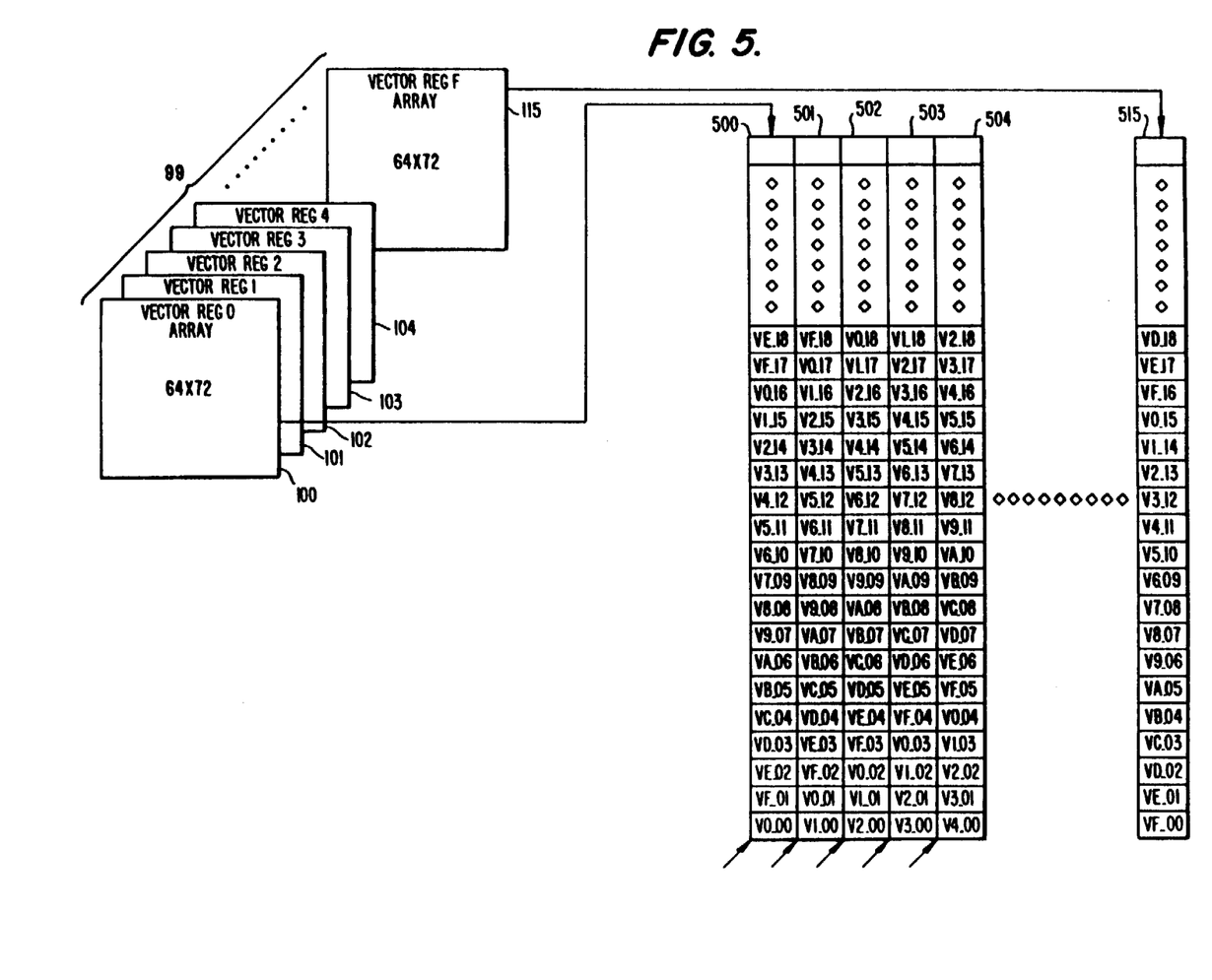
FIG. 5 is a conceptual diagram showing the helical or "barber pole" arrangement of vector register elements in the preferred embodiment of this invention.

An example of this arrangement is shown in FIG. 5. In FIG. 5, vector register file 99 is shown as well as the individual register arrays 0-F ("F" is 15 in hexadecimal notation). Each of the vector register arrays 100-115 contains 64 elements with 64 bits and eight parity bits. In actuality, however, the elements from the vector registers are stored in a helical or barber pole arrangement in sixteen banks shown as 500-515. Sequential elements of each of the banks are stored in successive banks. For example, the element 0 of vector register array 0 (designated V0 00) is stored in bank 500, and element 1 of vector register array 0 (designated V0 01) is stored as the second element of bank 501. The element 2 of vector register array 0 (designated V0 02) is stored as the third element of bank 502. This pattern continues as element 15 of vector register array 0 (V0 15) is stored as the 16th element of vector register array 515. The element 16 of vector register array 0 (V0 16), however, is stored back in bank 0 but as the seventeenth element.

The same pattern exists for the other vector registers. For example, in vector register 1, the element 0 (V1 00) is stored as the first element of bank 501 and element 1 of vector register 1 (V1 01) is stored as a second element of bank 502, etc. The method for determining the location of a vector element is that the m-th element of vector register n will be stored as the m-th element of bank m+n (mod 16) for sixteen banks.

More generally, the equation for determining the physical bank number is $[(V+I)+(J*E)]$ mod n, where V is the number of the virtual register, I is a bank offset value, J is a bank increment value, E is the number of the element of the virtual register, and n is the number of physical banks, which is preferably equal to the number of virtual register arrays. Also in the general case, the element number in a physical bank is determined by $[(E*K)+L]$ mod m, where K is an element increment value, L is an element offset value, and m is the number of elements in a physical bank. J and n should be mutually prime as should K and m. The increment values J and K are nonzero and equal to 1 in the preferred embodiment shown in FIG. 5.

As noted previously, this storage arrangement has several advantages for vector processing. While this arrangement does not extinguish the possibility of register access conflicts, it greatly reduces their occurrences. Furthermore, this arrangement guarantees that the conflict can be resolved without having to wait until all previous vector instructions complete.

It remains, however, to devise a means to detect the occurrence of conflicts. In accordance with the present invention, the vector register circuit can include means for sensing conflict conditions. FIG. 6 shows a preferred embodiment for such conflict detection in accordance with the present invention. In the preferred embodiment of the Vector Processing Unit 30 in FIG. 2, the elements shown in FIG. 6 are part of control logic 60.

In conflict detection circuitry 600, Source A Decode 602, Source B Decode 604, and DST Decode 606 are each four-into-sixteen decoders. The inputs to those decoders are the SRC A REG, SRC B REG, and DST REG signals, respectively. Each of those signals is a four bit signal received from the instruction parser in control logic 60 identifying a logical register location for an operation. Specifically, the instruction parser determines the SRC A REG, SRC B REG, and DST REG signals from the instructions sent from Scalar Processing Unit 15 indicating the logical vector registers containing the source of the operands (i.e., SRC A REG and SRC B REG) and the logical vector register to which the result is to be sent (i.e., DST REG). The 16-bit outputs of decoders 602, 604, and 606 are codes having one bit position activated and the rest deactivated.

The 16 bit codes are loaded into either adder source schedule register 610, multiplier source schedule register 615, or general source schedule register 618, according to the type of instruction which is to be executed. Thus, for an add instruction, the codes from decoder 602 and 604 would be loaded into adder source schedule register 610. Similarly, for a multiply instruction, the codes from decoders 602 and 604 would be loaded into the multiplier source schedule register 615. The outputs of source schedule registers 610, 615, and 618 would thus have either two activated bit positions for a dualoperand instruction, one activated bit position for a single operand instruction, or no activated bit positions if the operation corresponding to those registers was not to be used.

The registers are loaded in accordance with either the BIT SET ADD signal, the BIT SET MUL signal, or the BIT SET GEN signal generated by control logic 60. Each register 610, 615 and 618 is a shift register to effect the barber pole scheme discussed with regard to FIG. 5. Thus, when the vectors are initially loaded, as shown in FIG. 5, the actual addresses of the banks 500–515 correspond to the vector registers 0–F. After each vector operation, registers 610, 615, and 618 are shifted if the operation corresponding to that register is in progress. Such shifting of the activated bit effectively increments its position to correspond to the next bank to be the source of desired data in accordance with the barber pole scheme exemplified in FIG. 5.

As the vector operation continues with different elements, the position of the activated bit in each one of the registers 610, 615, and 618 shifts to indicate the actual memory bank from which the "source" data is to be obtained. The register outputs are then used for conflict detection using AND gate network 630 and OR gate network 635.

The elements of FIG. 6 which have been described thus far provide a means for detecting source conflicts. These elements may also be used to check the validity conflict. Lock register 620, which is preferably a storage register not a shift register, contains a 16-bit code indicating the destinations of previous instructions that may contain information needed for subsequent instructions. In this way, a determination can be made whether a subsequent instruction is requiring information from a source which does not yet have valid information.

If the needed information is the result of an ADD instruction, then the code for the destination of the data is a four bit signal ADD BIT SET. ADD BIT SET is an input to a four-into-sixteen decoder 621, which then sets a corresponding bit position in register 620. When that bit position is to be cleared, a four bit signal, ADD BIT CLR, is provided as an input to decoder 622 to clear the identified bit position. The MUL BIT SET and MUL BIT CLR, which are inputs to four-into-sixteen decoders 623 and 624, respectively, operate equivalently for multiply instructions. The ADD BIT SET, ADD BIT CLR, MUL BIT SET, and MUL BIT CLR signals are generated by vector address circuitry described below.

The 16-bit code from lock register 620 is an input into AND network 630 as are the outputs of the source registers 610, 615, and 618. AND network 630 comprises a plurality of two-input AND gates. Each two-input AND gate contains as inputs a different pair of outputs from registers 610, 615, 618, and 622 for the same bit position. For example, for bit position 0, there is a different two-input AND gate for lock register 620 in combination with each of the source schedule registers 610, 615 and 618, separately. In addition, for bit position 0, there is a different two-input AND gate in combination with each source schedule register 610 and 618, separately. Finally, for each multiplier source schedule register 615 at a bit position 0, there is a two-input AND gate for source schedule register 618. There would be a similar set of two-input AND gates for each other bit position.

The outputs of all of those two-input AND gates for each bit position are ORed together to form a 16-bit output, each bit corresponding to a different subarray. Thus, if any of the 16 bit positions is enabled, it is because there is a conflict at the register subarrays corresponding to that bit position.

OR gate 635 is a 16-input OR gate whose output is the source conflict signal. If any of the 16 inputs is enabled, the source conflict signal is enabled.

Destination conflicts are detected in a manner similar to the detection of source conflicts and validity conflicts. There are three sets of destination registers: the adder destination schedule register 640, the multipler destination schedule register 646, and the general destination schedule register 643. Each of these registers, which is a shift register, receives a 16-bit input from the destination decoder DST decode 606. The appropriate shift register would be loaded in accordance with the BIT SET ADD, BIT SET MUL, or BIT SET GEN signals from control logic 60 and shifted when a new element of a vector is being processed.

AND network 650 is similar to AND network 630 and produces a 16-bit output. If any of the outputs of the two-input AND gates in AND network 650 is enabled, there is a destination conflict in the register subarray corresponding to that bit position. A 16-input OR gate 655 produces an enabled destination conflict signal at its output if any inputs to OR gate 644 are enabled. The destination conflict signal and source conflict signals are then inputs into a two-input OR gate 660 which produces an enabled output if there is either a destination output, a source conflict or a validity conflict.

The output of OR gate 660 is an input into AND gate 662 and AND gate 664. AND gate 662 receives at one input terminal the inverted output of OR gate 660, and combines it with an INSTR signal which indicates the presence of an instruction. The output of AND gate 662 indicating "NO CONFLICT" is enabled if the output of OR gate 660 is not enabled and if there is an instruction to be executed by Vector Processing Unit 30. If the INSTR instruction is enabled and if there is either a destination conflict, a source conflict, or a validity conflict, as indicated by the output of AND gate 664, the "INSTR PENDING" signal is enabled indicating the presence of a conflict. This signal is used to tell control logic 60 not to send any more instructions until the conflict is resolved.

If there is a conflict, especially in writing data, then the data on the WT PORT0 has to be delayed. This is done as shown in FIG. 3A by a four stage shift register comprising 9 bit flip-flops 271, 272, 273, and 274. The WT PORT0 data is shifted into the different stages of flip-flops sequentially on the TA CLK clock pulse. The outputs of each of the flip-flops is an input into multiplexer 270 which receives as a control signal the WPORT0 CNF SEL signal that is buffered by latch 268. Latch 268 is under the control of the clock signal. The WPORT0 CNF SEL signal is generated by control logic 60 from the INSTR PENDING signals and the NO CONFLICT signals shown in FIG. 6.

The WPORT0 DATA signal from control logic 60 can be delayed up to three clock cycles, since this is the maximum number of major cycles which can occur before conflict-free operation. Both WPORT1 DATA and WPORT2 DATA are delayed only a single clock cycle by latches 266 and 267 respectively. The number of clock cycles with which is has to be delayed can be determined by control logic 60 based on the conflict detection circuitry 600. Based on such circuitry, the control logic 60 sets the WPORT0 CNF SEL signal appropriately to show that the multiplexer 270 reads out the WPORT0 DATA signals after being delayed the appropriate amount of time.

With the present invention, then, a vector register is provided which not only allows simultaneous reading and writing, thereby maximizing the pipelining and chaining capabilities, but also avoids occurrence of conflicts by organizing the memory in a barber pole arrangement. Any conflicts that are detected are only temporary until the registers can be synchronized and operate correctly with the barber pole storage arrangement.

One method of reflecting the helical or barber pole scheme of vector register addressing is suggested by the shift registers in the conflict detection circuitry of FIG. 6. To generate the actual addresses, a different method is used.

In accordance with the present invention, control means, coupled to the memory banks, provide access to words in the banks for storage and retrieval such that successive words for each of the vector registers correspond to words in different ones of the memory banks. The preferred embodiment of such circuitry for all the read and write ports is shown in FIGS. 7-9 as part of control logic 60.

FIG. 7 shows a preferred embodiment of address generation circuitry for multiplier 70, which receives as inputs data from RPORT1 and RPORT2 and provides an output on WPORT2. Counters 700 and 705 in FIG. 7 load the SRC A REG and SRC B REG signals in response to the MUL UNIT INSTR signal generated by control logic 60 during a multiply instruction. The SRC A REG and SRC B REG signals are received from the instruction parser in control unit 60, and are the same signals as those referred to in FIG. 6 for conflict detection. Once loaded, counters 700 and 705 count on the TB CLK signal. The outputs of counter 700 and 705 are the RPORT1 VREG SEL and RPORT2 VREG SEL signals, respectively, shown in the system view of FIG. 2.

The use of counters 700 and 705 helps effect the barber pole scheme shown in FIG. 5. With such counters, logical vector addresses, represented initially by the SRC A REG and SRC B REG signals, are stored in sequential banks since the bank numbers (RPORTx VREG SEL) increment as successive vector elements are accessed. In addition, since counters 700 and 705 are four bit (i.e., modulo 16) counters in the preferred embodiment, they recycle to 0 after they reach a count of 15. This is consistent with FIG. 5.

The RPORT1 VELM ADR and RPORT2 VELM ADR signals are generated as the RPORT1/2 VELM ADR signal by counter 708. These signals, which specify the addresses of each vector element, are preferably the same since in the preferred embodiment vector operations involve corresponding elements of two vector registers. For example, the addition of two vectors involves computing the sum of the first elements of each vector, the sum of the second elements of each vector, etc.

Counter 708 is cleared in response to the MUL UNIT INSTR signal. This reflects the preferred implementation in which the first element of any vector is always stored in the "0th" position in both the logical vector register and the bank. Each subsequent position in the logical vector register is then stored in a subsequent location in the bank being addressed. Counter 708 also increments on the TB CLK signal.

The RPORT1 RD EN and RPORT2 RD EN signals are generated by AND gates 712 and 710, respectively. These signals are the logical AND of the MUL UNIT INSTR signals with the LA SRC B VALID and LA MUL SRC A VALID signals, respectively. The LA MUL SRC A and B VALID signals are generated by the instruction parser in control logic 60 to indicate that the SRC A REG and SRC B REG signals are valid.

Register 714 and comparator 716 are used collectively to determine when the address generation for a multiply operation has been completed. A VLR (vector length register) signal from the instruction parser in control logic 60 indicates the length of the vector being processed. The VLR signal is a six-bit signal capable of representing the full complement of 64 elements in each bank or logical vector register in the preferred embodiment. The VLR signal is loaded into register 714 during a multiply instruction in response to the MUL UNIT INSTR signal. Comparator 716 then compares the output of register 714 to the RPORT 1/2 VELM ADR signal. When those signals are equal, comparator 716 enables its output, MUL LAST SRC VELM, to indicate the completion of the multiply operation.

In the preferred embodiment, the circuitry for generating the WPORT2 address also uses a counter. As shown in FIG. 7, counter 728 is loaded and incremented to produce the WPORT2 VREG SEL signal, and counter 736 is cleared and incremented to produce the WPORT2 VELM ADR signal. As is apparent, counters 728 and 736 for the WPORT2 addresses operate similarly to counters 700, 705, and 708 for the RPORT1 and RPORT2 addresses. The inputs to counters 728 and 736 are different, however, from the inputs to the counters 700, 705, and 708.

The value which is eventually loaded into the counter 728 is DST REG which, as the output of register 720, is placed in a pipeline comprising registers 724 and 726. The contents of register 726 is loaded into counter 728 when the START MUL WT signal is asserted.

The DST REG value in that three-stage pipeline of registers 720, 724, and 726 is shifted by the TB CLK signal which is generated once each major cycle by control logic 60. Because the multiply instruction takes three major cycles, this three stage pipeline generates a "lag" for the destination address to ensure that the WPORT2 VREG SEL signal is ready when the multiply operation result is complete. The MUL BIT SET and MUL BIT CLR signals referred to in FIG. 6 are generated as shown in FIG. 7.

The signal which causes counter 728 to be loaded and the counter 736 to be cleared is the START MUL WT signal which is generated three delay stages after the START MUL INSTR signal from control logic 60. The three-stage delay is created by registers 730, 732, 734, which each receive the TB CLK signal. These registers maintain the correct lag for WPORT2 behind RPORT1 and RPORT2.

The START MUL INSTR signal is generated by flip-flop 740 when it receives a MUL NO CNF signal from control logic 60 indicating the pendency of a multiply instruction and the absence of a conflict. Flip-flop 740 is cleared when the MUL LAST SRC VELM signal from comparator 716 is enabled, since that signal causes flip-flop 742 to generate a clock signal and input a "zero" to flip-flop 740.

Counters 728 and 736 increment when they receive TB CLK pulses and an enable signal, which is also the WPORT2 EN signal from the output of another three-stage pipeline. This pipeline includes registers 750, 752, and 754, all of which are timed by the TB CLK signal. The input into this three-stage pipeline is a MUL RD IN PROGRESS signal generated by control logic 60 when a multiply instruction is being performed. The purpose of the three-stage delay circuit including register 750, 752 and 754 is also to maintain the lag of WPORT2 behind RPORT1 and RPORT2.

The outputs of each of register 750, 752, 754 are inverted inputs to AND gate 760. Another inverted input into AND gate 760 is the MUL UNIT BUSY signal from control logic 60 which indicates that multiplexer 70 cannot accept another instruction. The output of AND gate 760 is a MUL UNIT DONE signal indicating that the multiplexer 70 has finished an instruction and no succeeding instructions are pending in the pipeline.

FIG. 8 shows a preferred embodiment of the address generation circuit for adder 80. This circuitry will not be explained in detail due to its similarity to FIG. 7, shown by the correspondence of elements. In particular, the elements used to generate the RPORT3 RD EN, RPORT4 RD EN, RPORT3 VREG SEL, RPORT4 VREG SEL, RPORT3/4 VELM ADR, WPORT1 VREG SEL, and WPORT1 VELM ADR signals use the same circuitry as used to generate the signals in FIG. 7. The hardware correspondence is emphasized by the similarity of numbering conventions between FIGS. 7 and 8.

The circuitry for generating the addresses for RPORT0 and WPORT0 is slightly different from the other circuitry, largely because RPORT0 provides an input to mask unit 90 and WPORT0 is an external input to the vector register. Unlike the outputs of multiplier 70 or adder 80, however, mask unit 90's output is not an input back into the vector register file, so there is no need for the same type of lag sychronization between RPORT0 and WPORT0 as for the other port.

As shown in FIG. 9, a counter 900 loads the SRC B REG signal in response to the LOAD GEN SRC signal. The LOAD GEN SRC signal also clears counter 905. The increment signal for both those counters is an INC GEN SRC REG signal. When that signal is activated, counters 900 and 905 count on the TB CLK signal. Both signals are generated by control logic 60.

The output of counter 900 is the RPORT0 VREG SEL signal. Counter 905 generates the RPORT0 VELM ADR signal. AND gate 930 generates the RPORT0 RD EN signal from the RPORT0 EN signal and the SRC DATA VALID signal.

Comparator 932 compares the RPORT0 VELM ADR signal to the VLR signal stored in register 935 by the GEN UNIT INSTR signal. The output of comparator 932 is the GEN LAST SRC VELM signal which, when enabled, indicates the last vector address. The GEN LAST SRC VELM signal is also used as an input to flip-flop 903 to reset flip-flop 902. Flip-flop 902 is set by the GEN STORE NO CONF signal from control logic 60 when no conflict is detected for RD PORT0. The output of flip-flop 902 sets flip-flop 901 to activate the INC GEN SRC REG signal and allow counters 900 and 905 to count.

Since WPORT0 need not be lag synchronized with RPORT0, there is no need for the delay circuit that appears in FIGS. 7 and 8 for multiplier 70 (RPORT1, RPORT2, WPORT2) and adder 80 (RPORT3, RPORT4, WPORT1) read and write ports. To generate the WPORT0 VREG SEL signal in the preferred embodiment, the DST REG signal is loaded into counter 712 in response to the LOAD GEN DST signal from control logic 60. The LOAD GEN DST signal also clears counter 914 whose output forms the WPORT0 VELM ADR signal.

The WPORT0 VELM ADR signal is also an input to comparator 947 along with the VLR signal from register 935. The output of comparator 947 is the GEN LAST DST VELM signal which indicates that the last vector element for a write instruction has been loaded into vector registers.

The GEN LAST DST VELM signal sets flip-flop 950 whose output, when activated, cause flip-flop 955 to reset. Flip-flop 955 sets in response to a GEN LOAD NO CONF signal from control logic 60 indicating no conflict for WT PORT0. The output of flip-flop 955 sets flip-flop 960 and activates the INC GEN DST REG signal to allow counters 912 and 914 to begin counting.

AND gate 931 receives as inputs the WPORT0 EN signal as well as the SRC DATA VALID signal, both of which are generated by control logic 60. The output of AND gate 931 is the WPORT0 WT EN signal.

It will be apparent to those skilled in the art that modifications and variations can be made in the vector register file of this invention. The invention in its broader aspects is not limited to the specific details, represented of methods and apparatus, and illustrative example shown and described. Departures may be made from such details without departing from spirit or scope of the invention.

What is claimed is:

1. A memory device for storing data into and receiving data from a logical vector register circuit accessed as a first number of register subarrays each containing a plurality of words, said memory device comprising:
   a second number of memory banks containing said words of said logical vector register circuit; and
   control means, coupled to said banks, for providing access to said words in said banks for storage and retrieval such that successive words in each of said register subarrays correspond to words in different ones of said memory banks, and such that successive words in each one of said memory banks correspond to words in different ones of said register subarrays.

2. The memory device of claim 1 wherein said first and second numbers are equal.

3. The memory device of claim 1 wherein said memory banks are organized sequentially in a repeating order and wherein successive words of each of said register subarrays correspond to words in sequential ones of said memory banks.

4. The memory device of claim 1 wherein said register subarrays are accessed by a logical vector register address received from said logical vector register circuit, and wherein said control means includes counters loaded with said logical vector register address.

5. The memory device of claim 4 wherein said control means also includes conflict detection means to prevent multiple accesses to the same register subarray at the same time.

6. The memory device of claim 4 wherein said counters include
   first counters to select different ones of the memory banks, and second counters to select different ones of the words in said memory banks.

7. The memory device of claim 4 wherein said counters include
   read counters containing logical vector register addresses for reading data from said memory device, and
   write counters containing logic vector register addresses for writing data into said memory device.

8. The memory device of claim 4 wherein said logical vector register circuit performs addition and multiplication operations using said data in said memory device, and
   wherein said counters include
      addition counters containing the logical vector register addresses used for said addition operations, and
      multiplication counters containing the logical vector register addresses used for said multiplication operations.

9. A method of accessing a memory device containing data organized as a first number of register subarrays each containing a plurality of words accessed by a logical vector register circuit, the method comprising the steps, performed by a memory device, of:
   storing said data into words in a plurality of memory banks of said memory device such that successive words in each of said register subarrays correspond to words in different ones of said memory banks; and
   storing said data into said words in said banks such that successive words in each one of said memory banks correspond to words in different ones of said subarrays.

10. The method of claim 9 wherein said step of storing successive words of each of said subarrays to correspond to words in different ones of said memory banks includes the substep of
    storing successive words of each of said register subarrays into sequential ones of said memory banks.

11. The method of claim 9 further including the step of forming logical vector register addresses for accessing said memory device, said logical vector register address forming step including the substeps of
    placing an initial logical vector address into a counter; and
    incrementing said counter to access successive one of said words.

* * * * *